United States Patent [19]

Georgopulos

[11] 4,084,874

[45] Apr. 18, 1978

[54] LOW INSERTION FORCE CONNECTOR

[75] Inventor: Thomas Georgopulos, Roselle, Ill.

[73] Assignee: GTE Automatic Electric Laboratories Incorporated, Northlake, Ill.

[21] Appl. No.: 810,227

[22] Filed: Jun. 27, 1977

[51] Int. Cl.² .............................................. H05K 1/07

[52] U.S. Cl. .............................................. 339/75 MP

[58] Field of Search .............. 339/17 L, 74 R, 75 MP, 339/176 MP

[56] References Cited

FOREIGN PATENT DOCUMENTS

| | | | |
|---|---|---|---|
| 48-5554 | 2/1973 | Japan | 339/176 MP |
| 1,096,938 | 12/1967 | United Kingdom | 339/176 MP |
| 184,297 | 7/1966 | U.S.S.R. | 339/17 L |

*Primary Examiner*—Neil Abrams

[57] ABSTRACT

A low insertion force electrical connector assembly for connecting to a printed circuit board, having a plurality of spaced contacts carried by and adjacent one edge. The body member has a circuit board receiving channel extending longitudinally along the body member for receiving the edge of the printed circuit board having the spaced contacts. The channel includes a pair of opposing fulcrums intermediate the bottom and the opening edge, one on each interior wall of the channel. The fulcrums leave a space therebetween for the passage of the circuit board. A first series of conductive strips is positioned along a first interior wall of the connector channel between said fulcrum and the bottom of the channel, and a second series of conductive strips is positioned along a second interior wall of said connector channel between the fulcrum and the opening edge of the channel. A second card positioning channel is located at the interior end of the card receiving channel for cooperating with the pair of fulcrums to position the card against the first and second series of conductive strips.

7 Claims, 3 Drawing Figures

LOW INSERTION FORCE CONNECTOR

BACKGROUND OF THE INVENTION

1. Field of the Invention

This invention relates in general to multiple electrical contact connectors and, more particularly, to a low insertion force connector for making edge connections with printed circuit boards.

2. Description of the Prior Art

In a connector socket of the type herein considered, the connector comprises a block having a spring contact mounted therein, and such spring contact is adapted to frictionally grip and thereby establish an electrical connection with a prong or male component inserted thereinto. It will be apparent that in order to effect such resilient engagement between the spring contact and male element, the spring contact must be compressed by insertion of the male element. If the connector has but one spring contact, the resistive force exerted thereby on a male element inserted into the connector is not sufficiently severe that it creates a problem of consequence. However, if the connector comprises a plurality of contacts oriented in a row so that each such contact resists the insertion of a single male element into the connector, the cumulative forces make initial insertion of the male element quite difficult. This is the situation with an edge connector for a printed wire board, for such a board is equipped with a plurality of conductors adapted to be respectively connected to individual circuit conductors through the intermediate agency of the connector. Thus, the connector is provided with a spring contact for each of the conductors provided by the board; and when an edge portion of the board is inserted into the connector, the cumulative forces of the individual spring contacts resist such insertion.

This difficulty cannot be overcome by making the individual spring forces weak, for then the retention forces applied by the individual spring contacts to a fully inserted board would not be large enough to properly and adequately anchor the connector to the board and to establish a good electrical connection between the individual spring contacts and the respective conductors provided by the board.

SUMMARY OF THE INVENTION

Accordingly, an object of the present invention is to provide a connector assembly that has a relatively high retention force upon an inserted conductor equipped board by the spring contacts, but which at the same time provides very little resistance during the initial insertion of the board.

This and other objects and features are attained in an electrical connector assembly for connecting to a printed circuit board consisting; of a body member having a card receiving channel extending longitudinally along the body member for receiving an edge of a printed circuit board having spaced contacts. The channel includes a pair of opposing fulcrums intermediate the bottom and the opening edge, one on each interior wall of the channel, with a space therebetween for the passage of the card. A first series of conductive strips are positioned along a first interior wall of the connector channel between the fulcrum and the bottom of the channel and a second series of conductive strips are positioned along a second interior wall of the connector channel between the fulcrum and the opening edge of the channel. A second card positioning groove is located at the interior end of the card receiving channel for cooperating with the pair of fulcrums to position the card against the first and second series of conductive strips as the card is rotated into position.

DESCRIPTION OF THE PREFERRED EMBODIMENT

Figure 1:
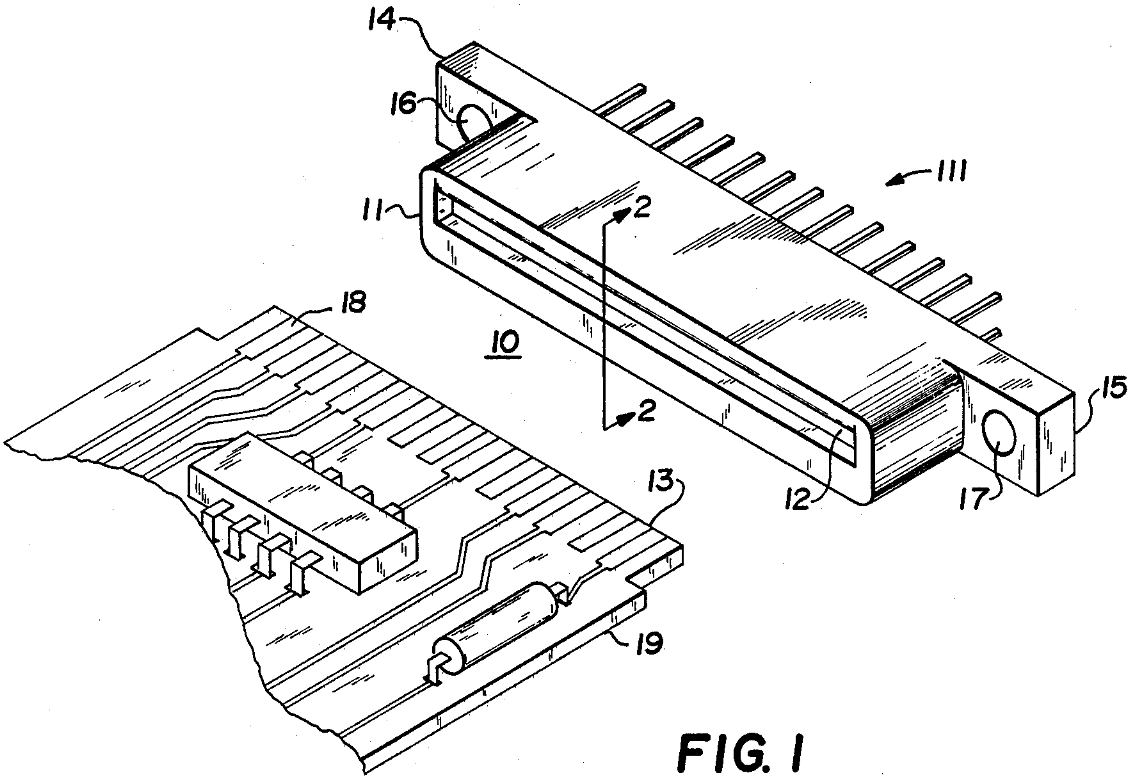
FIG. 1 is a perspective view of an edge connector structure embodying the invention, and shown in association with a fragmentary portion of a printed wire board prior to insertion thereof into the connector.

In accordance with the preferred embodiment of the present invention, the connector apparatus generally designated 10 includes a receptacle body portion 11 having a cavity 12 into which the edge 13 of a printed circuit card 19 may be inserted. The connector includes ears 14 and 15 at the ends thereof, which have apertures 16 and 17 so as to pass fastening members therethrough to facilitate their mounting onto a support structure. The edge 13 of the printed circuit card 19 includes a plurality of parallel conductive strips 18 on each side thereof in spaced apart relation. Mounted in the apertured body portion 11 are a plurality of contacts, the terminals of which are generally designated at 111, positioned along each wall of the cavity in longitudinal alignment.

Figure 2:
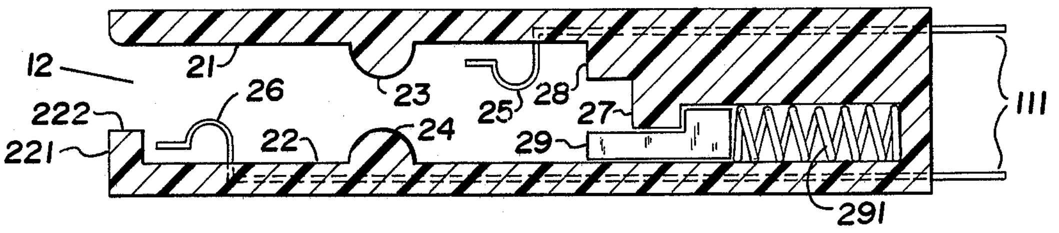
FIG. 2 is a sectional view along lines 2—2 of FIG. 1 showing the interior of the connector assembly.

By referring to FIG. 2, a sectional view through FIG. 1 in plane 2—2, the interior form of the cavity 12 may be seen. The entrance end has a short wall 221 below the center of the cavity. This wall by its surface 222 serves to support a card when it is inserted into the cavity. The two side walls 21 and 22 each have thereon a projection designated respectively 23 and 24, located at a distance intermediate the depth of the cavity. The contacts two of which are here shown at 25 and 26 are located in rows along each of the walls 21 and 22. Though these contacts are on opposite facing walls of the cavity, their contacting surfaces do not directly face each other. The contacting surfaced spring 25 is located interior of the projection 23 while the contacting surface of the contact spring 26 is located to the near side of the projection 24, closer to the opening.

Figure 3:
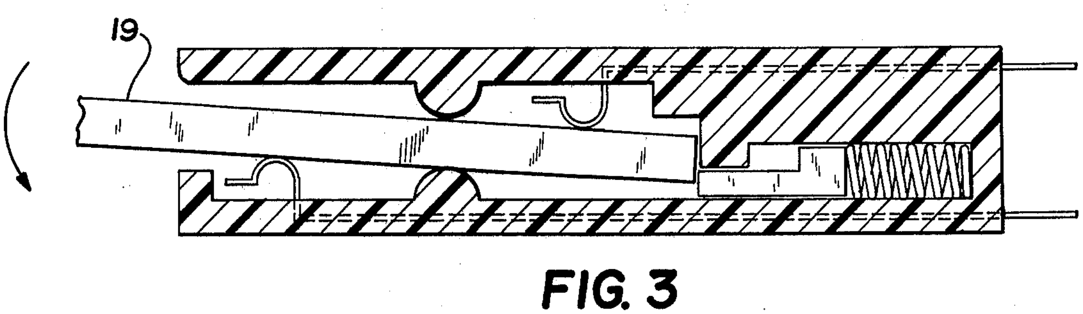
FIG. 3 is also a sectional view similar to FIG. 2 but including a printed circuit in the process of insertion into the connector.

At the extreme interior of the opening 12 a groove or key slot 27 is formed by the shoulders 28 and 29. Shoulder 29 is a portion of a bar that functions as a captive locking bar resiliently held in position by a spring 291 within the body portion, such that during the insertion of a card this bar is depressed to permit a card edge to be fully inserted before making contact with contact springs. To insert a printed circuit board 19 into this connector the contact 18 carrying edge 13 of the printed circuit board 19 is inserted into the connector opening 12 at such an angle as to enter between the projections 23 and 24 and to clear contacts 25 and 26, until the edge of the board encounters the locking bar shoulder 29 as shown in FIG. 3. The card 19 is further inserted to fully depress the locking bar. Thus, upon initial insertion no resistance due to contact spring forces is encountered and the only insertion resistance experienced is that caused by the depression of the locking bar spring 291 which is minimal. After fully depressing the locking bar spring 291 the card is rotated about the projection 24 until the card edge encounters shoulder 28 and the other sruface encounters support surface 222. At this point the contact springs 25 and 26 are in full contact on the board 19 and the locking bar 29 is released to return to its normal extended position to retain the card in an in line position.

What is claimed is:

1. An electrical connector assembly for connecting to a printed circuit board and the like, having a plurality of spaced contacts carried by and adjacent one edge comprising: a body member having a circuit board receiving channel extending longitudinally along said body member for receiving said one edge of said printed circuit board having said spaced contacts, said circuit board receiving channel defined by a first and second interior wall and an interior bottom surface, a pair of opposing fulcrums intermediate the bottom and the opening edge, one on each said first and second interior walls, and leaving a space therebetween for the passage of a circuit board, a first series of conductive strips positioned along said first interior wall of said circuit board receiving channel between one of said pair of fulcrums and said interior bottom of said circuit board receiving channel, a second series of conductive strips positioned along said second interior wall of said circuit board receiving channel between the other of said pair of fulcrums and the opening edge of said circuit board receiving channel, a circuit board positioning groove in the interior bottom surface of said circuit board receiving channel for cooperating with said pair of fulcrums for positioning said circuit board when said circuit board is rotated in an arc about one of said fulcrums into increased contact against said first and second series of conductive strips and means to retain said circuit board in such position of increased contact.

2. An electrical connector assembly as claimed in claim 1 further including a projecting stop along one edge of said circuit board receiving channel for limiting the arc of movement of a printed circuit board during insertion.

3. An electrical connector assembly as claimed in claim 2 wherein said body member is formed from an electrical insulating material.

4. An electrical connector assembly as claimed in claim 2 further including mounting means for attaching said assembly to a support means.

5. An electrical connector assembly as claimed in claim 2 wherein the leading edge of said circuit board positioning groove, on the side corresponding to the side of the circuit board receiving channel having a projecting stop is resiliently positioned to yield during the circuit board insertion operation and to return to its natural position upon completion of the insertion operation.

6. An electrical connector assembly as claimed in claim 5 wherein said body member is formed from an electrical insulating material.

7. An electrical connector assembly as claimed in claim 5 further including mounting means for attaching said assembly to a support means.

* * * * *